United States Patent [19]

Fukuhara et al.

[11] 4,271,535
[45] Jun. 2, 1981

[54] NOISE ELIMINATING SYSTEM

[75] Inventors: Hiroshige Fukuhara; Norio Fujiki, both of Yokohama, Japan

[73] Assignee: Nissan Motor Company, Limited, Kanagawa, Japan

[21] Appl. No.: 68,482

[22] Filed: Aug. 21, 1979

[30] Foreign Application Priority Data

Aug. 31, 1978 [JP] Japan .......................... 53-118488[U]
Nov. 17, 1978 [JP] Japan .......................... 53-157395[U]

[51] Int. Cl.³ .................... H04B 15/00; H04B 1/10
[52] U.S. Cl. .................................. 455/309; 358/167; 328/162
[58] Field of Search ............ 455/309, 308, 303, 302, 455/296, 67; 307/356, 358; 328/162, 165; 358/166, 167

[56] References Cited

U.S. PATENT DOCUMENTS

| | | | |
|---|---|---|---|
| 3,102,237 | 8/1963 | Elliott | 455/309 |
| 3,605,029 | 9/1971 | Freedman | 455/303 |
| 4,087,641 | 5/1978 | Sugai | 455/309 |
| 4,156,202 | 5/1979 | Takahashi | 455/303 |
| 4,164,758 | 8/1979 | Kowal | 455/309 |

Primary Examiner—Jin F. NG
Assistant Examiner—Tommy P. Chin
Attorney, Agent, or Firm—Lowe, King, Price & Becker

[57] ABSTRACT

A noise eliminating system is disclosed for use in a radio receiver including a detector. The system comprises a differentiation circuit for differentiating the signal fed thereto from the detector, a clipper circuit for limiting the amplitude of the signal applied thereto from the differentiation circuit below a clipping level, a clipping level control circuit responsive to the strength of the electric field received in the receiver for varying the clipping level at a rate multiple of the electric field strength, means responsive to the electric field strength for selectively setting the rate at one of a plurality of values, and an integrating circuit for integrating signal fed thereto from the clipper circuit.

4 Claims, 13 Drawing Figures

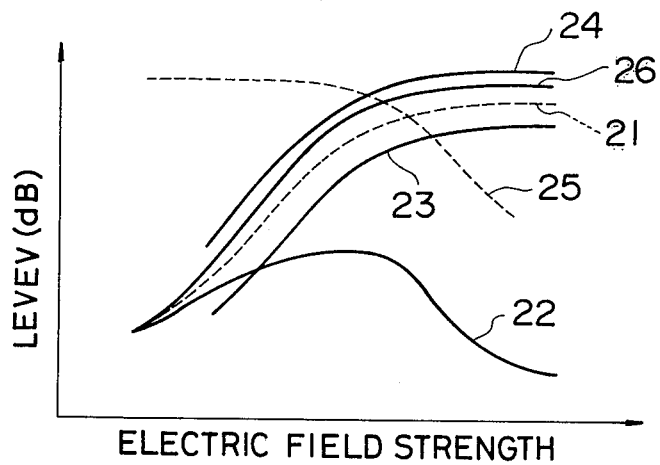
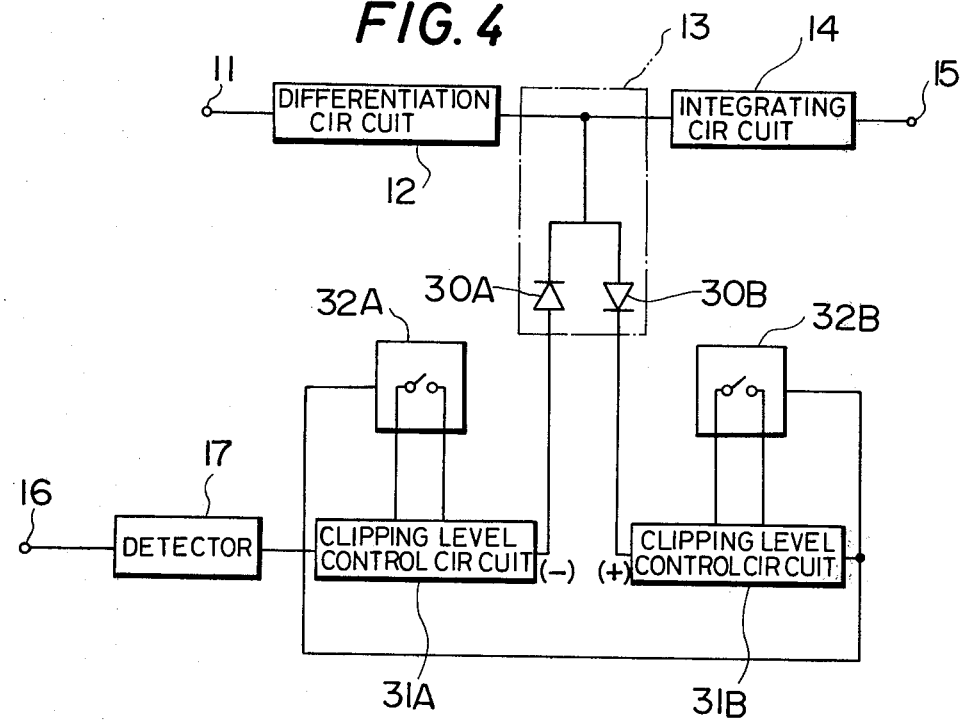

4,271,535

NOISE ELIMINATING SYSTEM

BANKGROUND OF THE INVENTION

1. Field of the Invention

This invention relates to a noise eliminating system for use in a radio receiver and, more particularly, to a system for eliminating impulse noise produced in a vehicle ignition device and the like and introduced on the signal received in the radio receiver.

2. Description of the Prior Art

In eliminating impulse noise introduced on the signal received in a radio receiver, it is conventional practice to limit the product of the frequency and voltage of the received signal below a predetermined level. However, this causes distortion of the signal component of the received signal at high electric field levels since the magnitude of the signal component increases above the predetermined level with increasing electric field strength.

In order to prevent such signal component distortion at high electric field levels, an attempt has been made to utilize the intermediate frequency signal or the automatic gain control signal of the radio receiver to control the clipping level in accordance with the strength of the electric field so that the clipping level is held above the peak level of the signal component over the whole range of electric field levels. However, it is preferable to set the clipping level as low as possible to maximize noise elimination although this tends to cause input signal distortion.

Further, the degree of elimination is dependent on the waveform of the received impulse noise and is greatest for impulse noises having a symmetrical waveform. Generally, the waveform of the impulse noise at the intermediate frequency amplifier stage is considered to be substantially symmetrical and it is distorted when the impulse noise passes through a detector in which either of its charging and discharging time constants is larger than the pulse width of the impulse noise.

SUMMARY OF THE INVENTION

It is therefore one object of the present invention to provide an improved noise eliminating system which will be free from the above mentioned disadvantages found in conventional systems.

Another object of the present invention is to provide a noise eliminating system which exhibits superior performance without any signal distortion over a wide range of electric field levels.

In accordance with the present invention, there is provided a noise eliminating system for use in a radio receiver including a detector. The system comprises a differentiation circuit for differentiating the signal fed thereto from the detector, a clipper circuit for limiting the amplitude of the signal applied thereto from the differentiation circuit below a clipping level, and a clipping level control circuit responsive to the strength of the electric field received in the receiver for varying the clipping level of the electric field strength. A selector circuit responsive to the electric field strength selects one of a plurality of different constants and a control circuit varies the clipping level in proportion to the product of the selected constant and the strength of the received electric field. An integrating circuit integrates the signal developed by the clipper circuit.

Other objects, means, and advantages of the present invention will become apparent to one skilled in the art thereof from the following description.

BRIEF DESCRIPTION OF THE INVENTION

The following explanation of preferred embodiments of the present invention will help in the understanding thereof, when taken in conjunction with the accompanying drawings, which, however, should not be taken as limiting the present invention in any way, but which are given for purposes of illustration only. In the drawings, like parts are denoted by like reference numerals in the several figures, and:

FIG. 3 is a graph of electric field strength versus signal level showing several characteristic curves provided by the conventional system of FIG. 2;

FIG. 4 is a block diagram showing one embodiment of the noise eliminating system of the present invention;

DESCRIPTION OF THE PREFERRED EMBODIMENTS

For a general understanding of the present invention, description will first be made of conventional noise eliminating systems with reference to FIGS. 1 to 3.

Figure 1A:
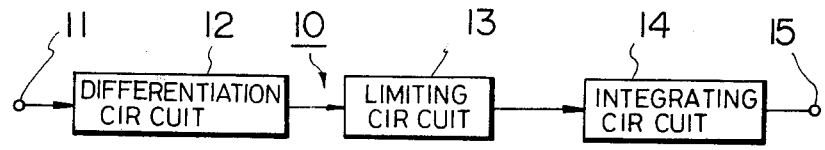
FIG. 1A is a block diagram showing a conventional noise eliminating system.

FIG. 1A illustrates a conventional noise eliminating system 10 which is adapted to limit the product of the frequency and voltage of the signal received in a radio receiver below a predetermined level. The signal A received at the input terminal 11 of the system is applied to a differentiation circuit 12 where it is differentiated. The differentiated signal B is coupled to an amplitude limiting circuit 13 where it is clipped, the output C from the limiting circuit 13 is then passed to an integrating circuit 14 where it is integrated. The integrated signal D appears at the output terminal 15 of the system 10.

Figure 1B:
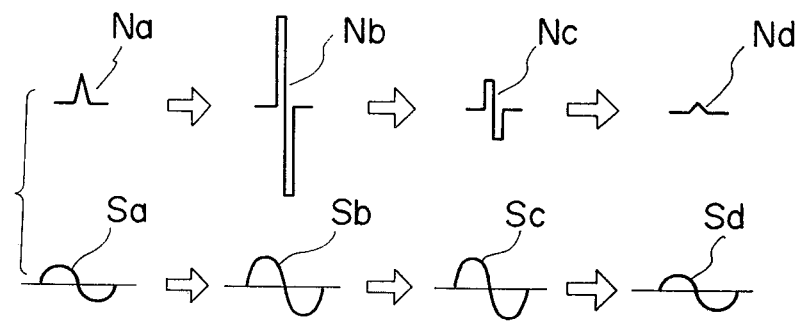
FIG. 1B shows the waveforms of the noise and signal components of the signals appearing at the various points of the system of FIG. 1A.

FIG. 1B illustrates the waveforms Na to Nd of the noise components included in the respective signals A to D and the waveforms Sa to Sd of the signal components included in the respective signals A to D. In view of the fact that the differentiated noise component is very large particularly when an impulse noise is introduced on the signal as can be seen from the waveforms. The limiting circuit 13 is set to have a clipping level larger than the amplitude of the signal component so as to pass the signal component with no distortion.

With such a noise eliminating apparatus, however, the signal component will be distorted at high electric field levels since the magnitude of the signal component increases above the predetermined clipping level with increasing electric field strength. In order to prevent the distortion of the signal component at high electric field levels, an attempt has been made to utilize the intermediate frequency signal or the automatic gain control signal of the radio receiver to control the clipping level of the limiting circuit 13 in accordance with the strength of the electric field.

Figure 2:
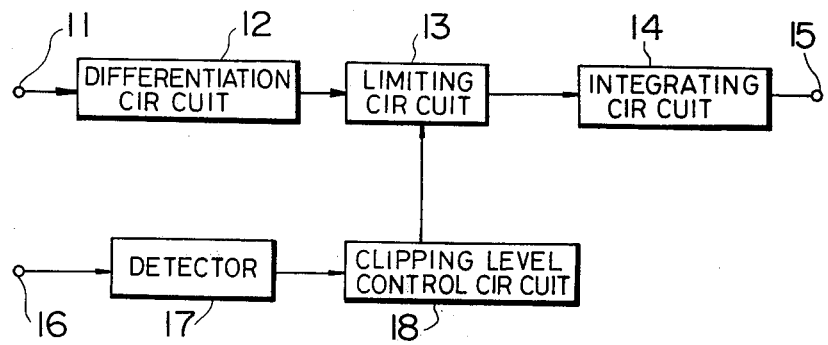
FIG. 2 is a block diagram showing another conventional noise eliminating system.

FIG. 2 illustrates another conventional noise eliminating system which utilizes the intermediate frequency of the radio receiver to control the clipping level of the limiting circuit 13. The intermediate frequency signal is applied to the input terminal 16 of a detector 17, the output of which is passed to a clipping level control circuit 18.

FIG. 3 is a graph of electric field strength versus signal level in db showing several signal characteristic curves provided by the noise eliminating apparatus of FIG. 2. Curve 21 relates to the mean level of the input signal, curve 22 relates to the background noise level, curve 23 relates to the DC voltage level appearing at the output of the detector 17, curve 24 relates to the output signal level, i.e., the clipping voltage level, which is the result of amplification of the DC voltage signal shown by curve 23, curve 25 relates to the impulse noise level produced by a vehicle ignition device or the like and introduced on the input signal which decreases at high electric field levels by the function of the automatic gain control performed in the radio receiver, and curve 26 relates to the peak level of the input signal shown by curve 21.

As shown in FIG. 3, the clipping voltage level (curve 24) is always held above the signal peak level (curve 26) in the above noise eliminating system in order to prevent distortion of the input signal over the whole range of electric field levels. However, it is preferable to set the clipping voltage level as low as possible in view of higher noise elimination effect although this would result in input signal distortion.

The present invention is intended to provide one satisfactory solution to meet an antithetical requirement for higher noise and signal distortion eliminating effects based upon the fact that greater importance may be attached to the noise signal eliminating effect so as to set the clipping voltage level (curve 24) below the signal peak level (curve 26) at low and intermediate electric field levels where the signal-to-noise ratio is low and the signal articulation is low so that any appreciable signal distortion cannot be sensed and further where the impulse noise level is high. Alternatively, greater importance may be attached to the signal distortion eliminating effect so as to set the clipping voltage level (curve 24) above the signal peak level (curve 26) at high electric field levels where the signal-to-noise ratio is high and the signal anticulation is high so that a listener can sense the signal distortion and where the impulse noise is suppressed by the function of the automatic gain control performed in the receiver.

Referring to FIG. 4, there is illustrated in block diagram form one embodiment of the noise eliminating system of the present invention. In FIG. 4, the signal received at the input terminal 11 of the system is applied to a differentiation circuit 12 where it is differentiated. The differentiated signal is coupled to an amplitude limiting circuit 13 made up of clipper diodes 30A and 30B where it is clipped. The clipped signal is passed to an integrated circuit 14 where it is integrated, and the output from the integrating circuit appears at the output terminal 15 of the system.

Further, the intermediate frequency signal of an radio receiver (not shown) is applied to the input terminal 16 of an detector 17. The output of the detector 17 is coupled to a negative clipping level control circuit 31A having therein switch means 32A responsive to the magnitude of the DC voltage from the detector 17, i.e., the strength of the received electric field, for reducing the amplification degree of the clipping level control circuit 31A so as to increase the clipping voltage level at high electric field levels. The output of the detector 17 is also coupled to a positive clipping level control circuit 31B having therein switch means 32B which is responsive to the magnitude of the DC voltage from the detector 17 for reducing the amplification degree of the clipping level control circuit 31B so as to reduce the clipping voltage level at low and intermediate electric field levels and for increasing the amplification degree thereof so as to increase the clipping voltage level at high electric field levels.

Figure 5:
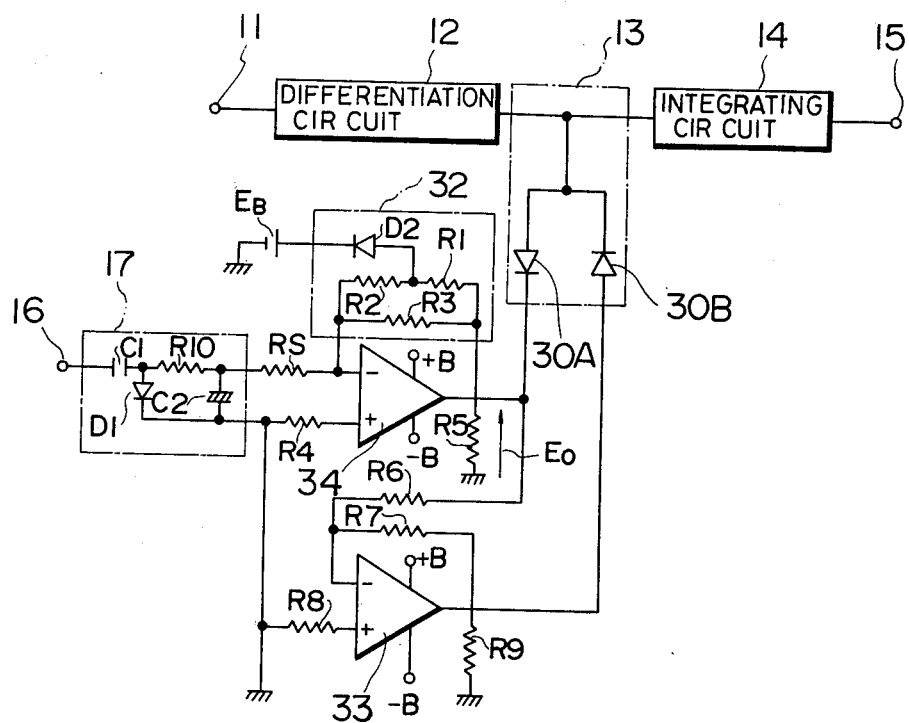
FIG. 5 is a circuit diagram showing the detailed structure of the system of FIG. 4.

Referring to FIG. 5, the noise eliminating system of the present invention will be described in more detail. The switch means 32 comprises a resistor $R_1$, a resistor $R_2$ connected in series with the resistor $R_1$, and a resistor $R_3$ in parallel with series resistors $R_1$ and $R_2$. A switching diode $D_2$ has its cathode connected to the junction of the resistors $R_1$ and $R_2$ and its anode connected to a bias DC power source EB. In FIG. 5, the characters $C_1$ and $C_2$ indicate capacitors, the characters RS and $R_4$ to $R_{10}$ indicate resistors, and the character $D_1$ indicates a diode. The numerals 33 and 34 designate amplifiers having the same function as that of the clipping level control circuits 31A and 31B, respectively. The amplifiers 33 and 34 may be taken in the form of an integrated circuit. The amplifier 33 is adapted to develop at its output a voltage having a polarity opposite to that of the amplifier 34. The resistors $R_1$ to $R_3$ together with the resistor RS determine the amplification degree of the amplifier 34.

Assuming that the DC power source EB has a potential EB and that the resistors RS and $R_1$ to $R_3$ have resistance values RS and $R_1$ to $R_3$, respectively, the degree of amplification $A_1$ of the amplifier 34 when the clipping voltage level Eo, i.e., the output voltage of the amplifier 34 is below $EB \cdot (R_1+R_2)/R_2$ is given by:

$$A_1 = -\frac{R_3 \cdot (R_1 + R_2)}{R_1 + R_2 + R_3} / RS$$

Thus, the output signal of the detector 17 is applied through the amplifier 33 as a clipping level to the diode 30B.

If the clipping voltage level Eo exceeds the value $EB \cdot (R_1+R_2)/R_2$, the switching diode $D_2$ turns on and the amplification degree of the amplifier 34 is expressed as:

$$A_2 = -R_3/RS$$

Therefore $$|A_2| > |A_1|$$

Under this condition, the reference voltage of the amplifier 33 increases and the amplifier 33 provides a higher clipping voltage level.

Figure 6:
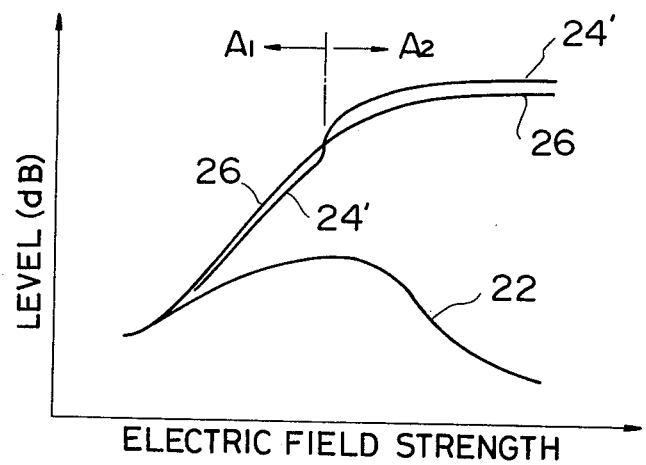
FIG. 6 is a graph of electric field strength versus signal level showing several characteristic curves provided by the system of the present invention.

FIG. 6 is a graph of electric field strength versus signal level in db showing several characteristic curves provided by the noise eliminating system of the present invention. Curves 22, 24 and 26 relates to the background noise level, clipping voltage level, and signal peak level, respectively. As shown in FIG. 6, the clipping level characteristic curve 24' is below the signal peak level characteristic curve 26 when the amplification degree of the clipping level control circuit is low at low and intermediate electric field levels, whereas it is above the signal peak level characteristic curve 26 when the amplification degree of the clipping level control circuit is high at high electric field levels.

Although the amplification degree of the clipping level control circuit is switched in two steps $A_1$ and $A_2$ in accordance with the strength of the received electric field in the above embodiment, it is to be noted that a desired number of switch means may be provided in the clipping control circuit so as to switch the amplification degree of the clipping level control circuit in a plurality of steps in accordance with the strength of the received electric field.

Figure 7:
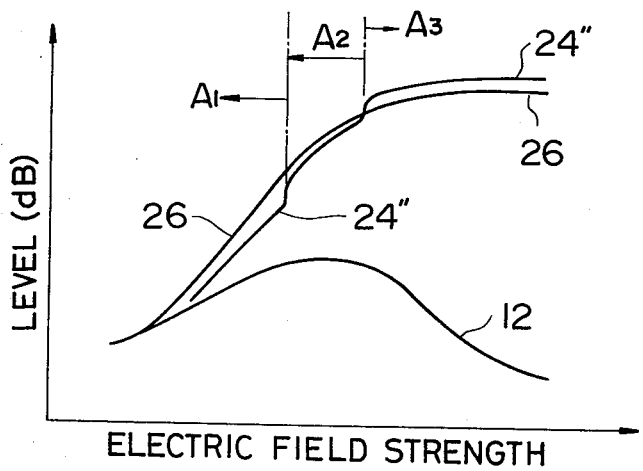
FIG. 7 is a graph of electric field strength versus signal level showing several characteristic curves provided by an alternative embodiment of the present invention.

FIG. 7 is a graph of electric field strength versus signal level in db showing clipping level and signal peak level characteristic curves 24" and 26 provided by a noise eliminating system in which three switch means are provided in the clipping level control circuit so as to switch the amplification degree of the clipping level control circuit in three steps $A_1$, $A_2$ and $A_3$.

In the above embodiments of the present invention, at least two switch means are provided in the clipping level control circuit. The switch means are responsive to the received electric field strength for automatically switching the amplification degree of the clipping level control circuit in a plurality of steps so as to set a plurality of clipping voltage levels in accordance with the received electric field strength. This permits higher noise eliminating effect at low and intermediate electric field levels with no signal distortion even at high electric field levels.

The noise eliminating system can provide its maximum performance for noises having a symmetric waveform. The noise received in a radio receiver has its waveform rendered nonsymmetric when passed through the detector of the receiver. Thus, it is preferable to prevent production of any nonsymmetric component on the noise during the noise passing through the detector.

Figure 8:
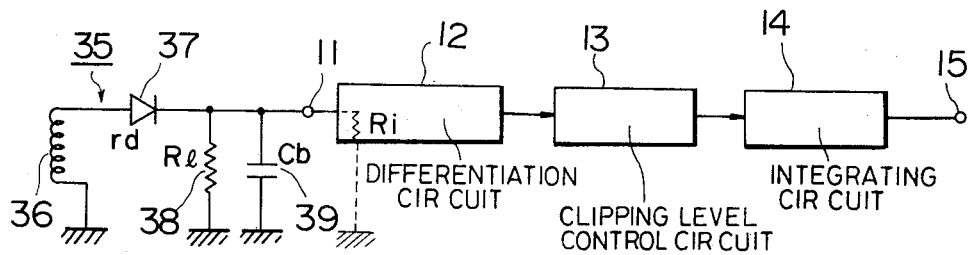
FIGS. 8 and 9A to 9D are diagrams used to explain the principle of a third embodiment of the present invention.

FIG. 8 illustrates a conventional envelope detector 35 connected to the noise eliminating system of the present invention. The detector 35 comprises a coil 36, a diode 37 having an internal resistance rd, a load resistor 38 having a resistance Rl, and a bypass capacitor 39 having a capacitance Cb. The differentiation circuit 2 has an input resistor 41 having a resistance Ri.

The charging and discharging time constants To and Td of the detector 35 are expressed as:

$$\tau o \approx 1/(rd \cdot Cb) \text{ and } \tau \approx 1/(R \cdot Cb)$$

where $R = Rl \cdot Ri/(Rl + Ri)$

Figure 9A:
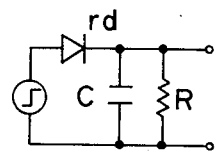
Figure 9C:
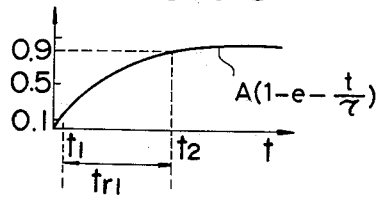

Assuming now that a pulse signal having a unit amplitude is inputted to a circuit as shown in FIG. 9A which includes a capacitor C in parallel with a resistor R and connected in series with a diode having a forward internal resistance rd, the rise time $tr_1$ of the pulse signal is given by $$tr_1 \approx 2.2 \, \tau o \approx 2.2/(2\pi fo) \tag{1}$$

and the breaking time $tr_1$, thereof is given by $$tr_1' \approx 2.2 \, \tau d \approx 2.2/(2\pi fd)$$

where $\tau o = 1/(2\pi fo)$, $\tau d = 1/(2\pi fd)$, and fo and fd are frequencies causing a 3 db level drop.

Figure 9B:
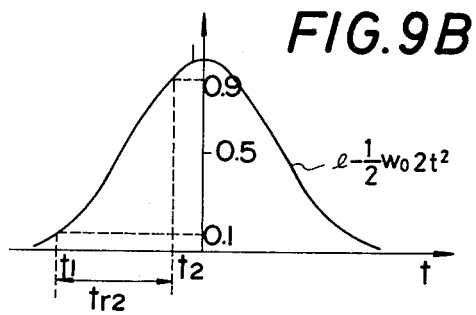

If the waveform of the impulse noise at the intermediate frequency amplifier stage of the receiver is approximated with a Gaussian characteristic filter pulse response waveform as shown in FIG. 9B, the rise time or breaking time $tr_2$ is given by $$tr_2 = 1.7/(\pi B) \tag{2}$$

where B ($=2fo$) is the 3 db band width of the receiver.

To coincide the waveform of the detected impulse noise with that of the impulse noise before application to the detector, the rise time and breaking time $tr_1$ should be smaller than the impulse noise rise time and breaking time $tr_2$ and thus $$tr_1 < tr_2 \tag{3}$$

From equations (1), (2) and (3), we obtain $$2.2\tau < 1.7/(\pi B) \text{ or } \tau < 1/(1.3 \, B) \tag{4}$$

Figure 9D:
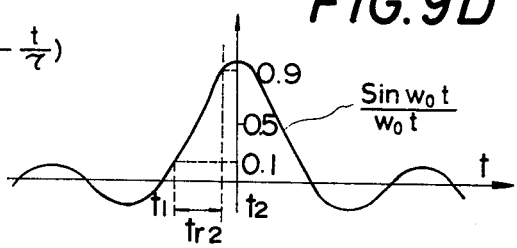

If the waveform of the impulse noise with an ideal filter pulse response waveform as shown in FIG. 9D, the rise time and breaking time $tr_2$ is given by $$tr_2 = 2.1/(\pi B) \tag{5}$$

From equations (1), (3) and (5), we obtain $$2.2\tau < 2.1/(\pi B) \text{ or } \tau < 1/(\pi B) \tag{6}$$

Accordingly, it is possible to pass the impulse noise through the detector without any deformation of the waveform if the circuit constants rd, Rl, Ri and Cb are suitably selected to meet the condition $\tau o < 1/(\pi B)$ and $\tau d < 1/(\pi B)$, whereby the noise eliminating system can provide its optimum noise eliminating performance.

While the present invention has been shown and described with reference to some preferred embodiments thereof, and with reference to the drawings, it should be understood that various changes and modifications may be made to the form and the detail thereof, by one skilled in the art, without departing from the scope of the present invention. Therefore, it should be understood by all those whom it may concern that the shown embodiments, and the drawings, have been given for the purposes of illustration only, and are not intended to limit the scope of the present invention, or of the protection sought to be granted by Letters Patent, which are solely to be defined by the accompanying claims.

What is claimed is:

1. A noise eliminating system for use in a radio receiver for receiving an electric field, comprising:
   a detector circuit for detecting the strength of the received electric field and developing a signal corresponding thereto;
   a differentiation circuit for differentiating said detector signal;
   a clipper circuit for limiting the amplitude of an output signal from said differentiation circuit below a clipping level;

a selector circuit for selecting one of a plurality of different constants in accordance with the strength of the received electric field;

a control circuit for varying the clipping level in proportion to the product of the selected constant and the strength of the received electric field; and an integrating circuit for integrating an output signal from said clipper circuit.

2. A noise eliminating system according to claim 1, wherein said selector circuit includes means for selecting a constant lower than unity when the strength of the received electric field is below a predetermined value and another constant higher than unity when said field strength is above the predetermined value.

3. A noise eliminating system according to claim 1, wherein said control circuit comprises amplifier means for amplifying the electric field strength and said selector circuit includes means for stepwise changing an amplification factor of said amplifier means.

4. A noise eliminating system according to claim 1, wherein said detector circuit includes an RC circuit wherein the charging and discharging time constants of said RC circuit are smaller than $1/\pi B$, where B is the 3 db bandwidth of said receiver.

* * * * *